United States Patent
Strobl

(10) Patent No.: US 9,738,973 B2
(45) Date of Patent: Aug. 22, 2017

(54) SCALABLE CVD FILM AND NANOMATERIAL SYNTHESIS

(71) Applicant: CVD Equipment Corporation, Central Islip, NY (US)

(72) Inventor: Karlheinz Strobl, Mount Sinai, NY (US)

(73) Assignee: CVD Equipment Corporation, Central Islip, NY (US)

( * ) Notice: Subject to any disclaimer, the term of this patent is extended or adjusted under 35 U.S.C. 154(b) by 27 days.

(21) Appl. No.: 14/735,080

(22) Filed: Jun. 9, 2015

(65) Prior Publication Data

US 2015/0361549 A1 Dec. 17, 2015

Related U.S. Application Data

(60) Provisional application No. 62/012,178, filed on Jun. 13, 2014.

(51) Int. Cl.
B32B 3/00 (2006.01)
C23C 16/458 (2006.01)

(52) U.S. Cl.
CPC ..... *C23C 16/458* (2013.01); *Y10T 428/24777* (2015.01)

(58) Field of Classification Search
CPC ................. C23C 16/458; C23C 16/453; Y10T 428/24777
See application file for complete search history.

(56) References Cited

U.S. PATENT DOCUMENTS

| 2013/0337170 A1 | 12/2013 | Li | |
|---|---|---|---|
| 2014/0113074 A1 | 4/2014 | Li | |
| 2014/0370189 A1* | 12/2014 | Li | C23C 16/26 427/177 |

* cited by examiner

*Primary Examiner* — Elizabeth Mulvaney
(74) *Attorney, Agent, or Firm* — Schroeder Law PC

(57) ABSTRACT

The present invention relates to tools and system designs for chemical vapor deposition (CVD) systems and CVD synthesis used to deposit one or more thin film layers onto a flexible substrate or to grow nano-structured materials on large area flexible substrates and, more particularly, to scalable CVD coating and nanostructure manufacturing including CVD thin films and nano-structured materials such as nanotubes, nanowires and nanosheets.

20 Claims, 5 Drawing Sheets

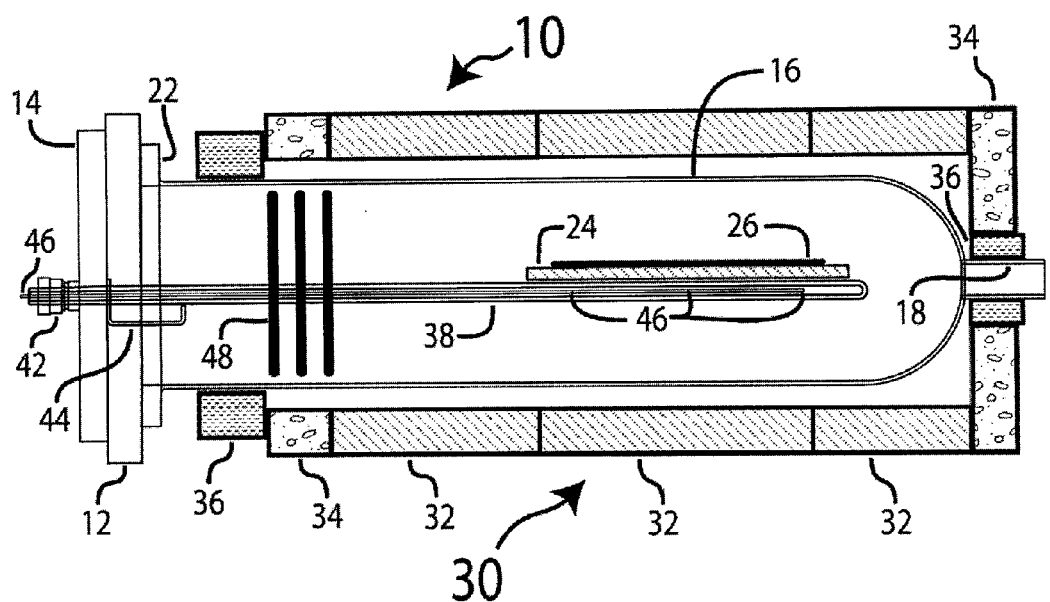
Figure 1: Prior Art
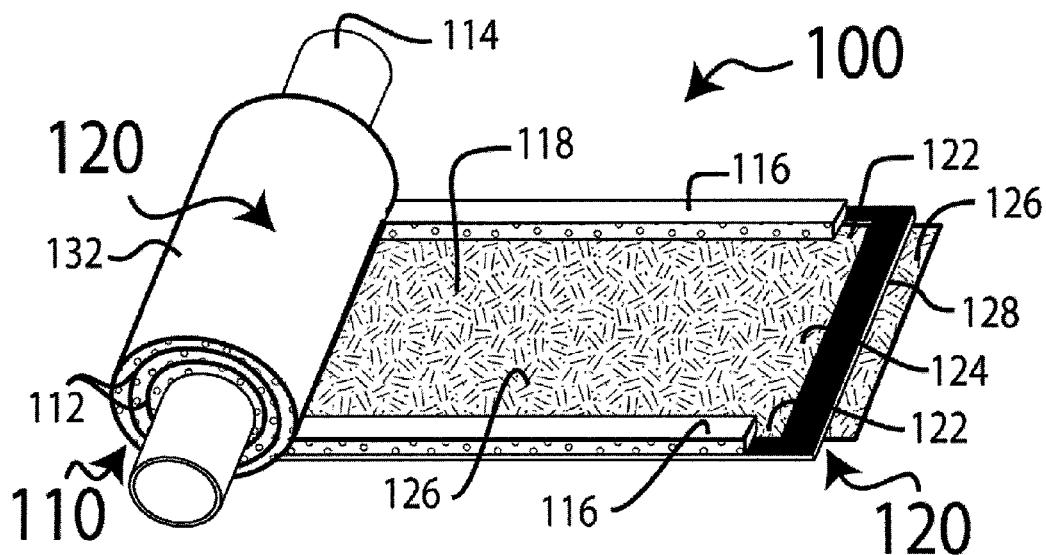
Figure 2

SCALABLE CVD FILM AND NANOMATERIAL SYNTHESIS

This application claims the benefit of U.S. Provisional Application No. 62/012,178, filed on Jun. 13, 2014.

BACKGROUND OF THE INVENTION

The present invention relates to substrate remounting and system designs for chemical vapor deposition (CVD) systems and CVD synthesis used to synthesize at least one layer or to grow at least one nano-structured material on at least one surface of a flexible substrate, and more particularly, to scalable thin film coating and nano-structured material manufacturing of products such as nanotubes, nanowires, and nanosheets.

Those skilled in the art will recognize that there is an ongoing interest in economical solutions that enable the manufacturing in large volume of higher quality, nano-structured materials (e.g., in tube, fiber or wire format, such as 1-5 mm tall, 10-20 nm thick vertically aligned carbon nanotubes; 100-200 nm thick vertically aligned carbon nanofibers; 10-50 µm long, 50-100 nm thick random or vertically aligned silicon nanowires as can be synthesized by CVD processes on, for example, flexible stainless steel foil).

It will be recognized that the ability to produce higher quantities of higher quality nano-structured materials at lower production cost per usable coated area is desirable, for example, to unlock many of the potential benefits that nano-structured material and CVD surface modification research has created over the last 20 years. In this regard, the lack of related economical production solutions has hindered commercialization efforts.

US patent application 2014/0113074 A1 is directed to a graphene manufacturing process utilizing a Cu foil substrate roll, which together with a gas porous material layer, is rolled up into an Archimedes spiral roll. However, the gas porous material interferes with local surface processing, and hinders the growth of undisturbed, higher quality nano-structured materials like carbon nanotubes and silicon nanowires.

Nearly all prior art has remained focused on roll-to-roll CVD systems for providing solutions for increased productivity and lower large area production costs of CVD processed flexible substrates. Such an approach, however, necessarily requires that the length and/or size of the CVD reactor chamber be increased. Additionally, the processing conditions developed with batch process CVD systems used for research and development (R&D) are typically not directly portable to roll-to-roll CVD systems, which then typically requires multiple generations of pilot system development prior to scale up to a production roll-to-roll CVD system. This thus increases the capital cost, development risk and commercialization time frame of roll-to-roll CVD projects, often putting it out of reach for many smaller/startup corporations. As a result, the scale up of large area CVD processed films and/or nano-structured material covered flat substrates has, in the past, only been implemented commercially on a selective basis for high volume applications. It will be appreciated that this type of a project risk typically could be afforded only by large corporations with preexisting product sales channels.

There is therefore a need in the art for the ability to transfer processes for nano-structured materials or thin film surface modifications utilizing flexible substrates and developed on batch process CVD systems to volume production with batch process CVD system solutions that are less risky and costly to scale up. In addition, it is desirable that such batch process solutions allow processing of one or more rolls of flexible substrates. Further, it is desirable that such a system solution be adaptable to a range of CVD processing needs, without costly hardware changes or upgrades.

SUMMARY OF THE INVENTION

It is a first objective of this invention to create a manufacturing solution compatible with a batch R&D CVD system that enables the CVD processing of a roll of a flexible material in a substantially uniform manner.

It is a second objective of this invention to enable the CVD processing of at least one flexible substrate with a CVD batch process system where the length of the flexible substrate is greater than 5 times the diameter or width of the respective CVD reactor chamber.

It is a third objective of this invention to be able to utilize substantially similar process recipes for both R&D CVD batch reactors processing a flat substrate and CVD batch reactors of this invention processing a 5-100× larger flexible substrate area.

It is a fourth objective of this invention to have similar CVD system designs and hardware for CVD processing of flexible substrates for a range of CVD processes.

It is a fifth objective of this invention to enable the growth of a nano-structured material over at last one surface of a rolled up flexible substrate that is located inside a process chamber of a CVD System.

It is a sixth objective of this invention to provide a system solutions for both hot wall and cold wall CVD processing of large area flexible substrates.

It is a seventh objective of this invention to lower the production cost and development cost for scaling up CVD processing of flexible materials It is an eight objective of this invention to provide a method to remount a flexible substrate roll to that is can be processed as a whole in a batch CVD process.

These and other objects of the present invention are accomplished by the novel substrate remounting method of this invention and its utilization in the batch process CVD synthesis. This substrate remounting method requires the unrolling of a flexible substrate roll, and the subsequent re-rolling of such substrate roll into an Archimedes spiral in such a manner that each layer (of the roll) is spaced apart by two or more gas porous strips that provide both a constant spacing function and the process gas exchange between the inner and other regions of such remounted substrate roll.

The CVD processing of flexible substrates is intended to include any type of CVD processing of flexible process compatible substrates having a thickness that is less than $\frac{1}{25}$ of the longest dimension of the substrate. Examples of such flexible substrates are stainless steel, copper, platinum and plastic foils in the 10-200 µm thickness range. Of course, the process temperature stability of a given substrate generally determines the suitability of a given substrate for a given CVD process. For example, ultra-low temperature CVD processes are suitable for plastic films, which are typically processed at a temperature of less than 100° C.

The term CVD Synthesis in the context of this invention is intended to include any precursor gas, or liquid film deposition, or wetting, or any solid or powder coatings laid on top of the substrate that can then be converted into a usable surface modification, or nano-structured material growth with gas and/or liquid delivery system and with a heating solution (either external or internal) that is able to sufficiently isolate a respective process region from the outside atmosphere and to deliver a required time dependent heat profile. It is intended to also include continuous, pulsed and time sequenced (atomic layer deposition with self-limiting process gas exposures) precursor dispensation onto the substrate area and it includes all pressure ranges suitable for a given CVD process, i.e., ranging from $10^{-6}$ mTorr to 760 Torr and higher.

Typically, $C_2H_4$ is used as a preferred carbon-containing precursor gas for carbon nanotube growth. However, gases such as $C_xH_y$ (e.g., $C_2H_2$, $C_2H_4$, $CH_4$, etc.), ethanol, and methanol can also be used. Ar or $N_2$ are typically used as inert process gases (push gas). $H_2$ and optionally an oxygen-containing gas, e.g., $O_2$, $H_2O$ or Ozone, are typically utilized in one or more process steps. $SiH_4$, or $HSiCl_3$ or $SiCl_4$ is often used for silicon nanowire growth and nickel carbonyl, for example, can be used to deposit a Ni film onto a surface.

The heating of the flexible substrate can happen via an external heating source (resistive oven, infrared, radio frequency induced) or via an internal direct or alternative current flowing through a partially conductive flexible substrate, and the CVD process can be a hot wall or cold wall process.

It is contemplated that the substrate remounting method of the present invention can be retrofitted into existing CVD systems for increased production capacity, and that customized CVD system designs with optimized loading capacity in accordance with this invention, together with custom tuned CVD processes, can provide cost optimized production solutions for each given nano-structured material or surface modified flexible substrate manufacturing challenge.

Thus, this invention relates, at least in part, to CVD batch processing systems enclosing one or more flexible substrates with one or two-sided catalytic active surfaces that in total have a large usable surface area on which such nano-structured materials can be synthesized. Another aspect of this invention addresses economical CVD process solutions for surface modification of flexible substrates, such as increasing the corrosion resistance of steel foil by enriching its surface layer with suitable chemicals, e.g., Ni, Cr, C, to make such layer more "stainless steel-like".

BRIEF DESCRIPTION OF THE DRAWINGS

FIG. 1 shows a prior art R&D CVD process chamber.
FIG. 2 shows a process gas accessible remounted substrate roll.

DETAILED DESCRIPTION OF THE INVENTION

Figure 3:
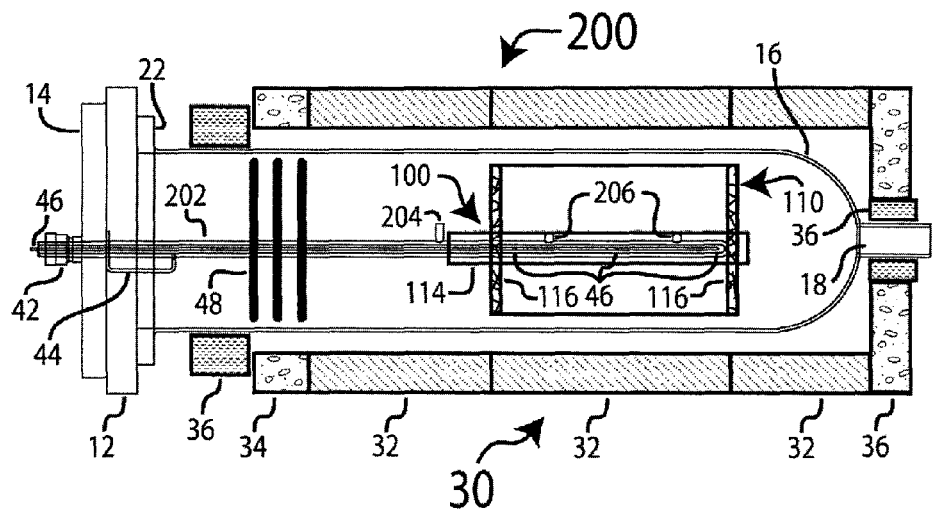
FIG. 3 shows a CVD reactor with a horizontal process tube and a horizontally oriented remounted substrate roll.

FIG. 1 shows the components of a prior art R&D CVD horizontal tube furnace system, which includes a heated process chamber 10. The chamber 10 includes a gas ring 12, an end cap 14 and a asymmetric process tube 16 with a narrowed down neck exhaust gas port 18 on one side and a flange 22 on the other side. The chamber 10 is formed by a sealed arrangement (i.e., with o-rings and cooling to protect the seals) of gas ring 12, process tube 16, end cap 14, and all respective entry and exhaust gas ports. The process tube 16 is surrounded (at least during part of the CVD processing time) by a resistive oven 30, which can have multiple individually controllable heating zones 32, insulating end zones 34, and optionally flexible and removable insulating structure 36, i.e., flexible insulating collars made from quartz fibers or ceramic wool, between the oven end zones 34 and the process tube 16. Various systems/methods (not shown) are used in prior art systems for injecting and distributing one or more process gases into the chamber 10. Inside the chamber 10 a substrate holder 24 is used to locate and support a substrate 26 for CVD processing. Alternatively, in prior art CVD systems, a thin flexible substrate 26 having a width that is typically less than ½-¾ of the full inner circumference of the process tube 16 is placed on the bottom of the tube 16 without any holder 24. Alternatively, in prior art systems, a flexible substrate is rolled and crimped into the shape of a hollow cylinder shape, and optionally is supported on the inside by a hollow quartz liner. For prior art CVD systems, such thin and flexible substrates 26 can therefore, at a maximum, be as long as the circumference of the process tube and as wide as the uniform heated zone of the process tube, i.e., the usable area between the length of the heating zone and 1-3×Ø, with Ø=inner diameter of the process tube 16.

FIG. 1 shows a particular embodiment of the prior art where the substrate holder 24 is secured to a transfer arm 38 that is held and connected to the end cap 14 through a seal 42, and is additionally mechanically supported with a bracket 44. The arm 38 is also shown to be hollow on the inside and to hold multiple thermocouples 46 terminated at different distance from the end cap that can be used to control matching multiple heating zones 32, respectively. Additionally, one or more thermal baffles 48 (e.g., light scattering white quartz discs) are shown located on the arm 38 that reduce the heat loss from the heated section of the process tube towards the gas ring 12 and end cap 14.

Other prior art research CVD systems use a symmetric straight process tube that extends a significant distance beyond the oven 30, with each end connected to respective end caps in a sealed and sufficiently air or water cooled manner.

The width and length or diameter of a single substrate 26 that can be inserted into a given process tube 16 and successfully processed with a respective prior art CVD systems is thus limited by the inside diameter Ø of the tube 16. To increase the productivity of such prior art CVD systems for the case of rigid round wafer substrates, such substrates may be positioned vertically in a wafer boat with equal spacing between them and oriented parallel to the end cap, i.e., perpendicular to the main gas flow direction inside the tube 16, to allow process gas to get in between them. Thus, while this provides the option of processing more surface area, it still prevents the option of processing a flexible substrate having a length that is significantly longer than 3 times the inner diameter Ø of the tube 16.

FIG. 2 shows several embodiments of this invention in the form of a process gas accessible mounted substrate roll 100 that includes a remounted substrate roll 110 with individual layers 112 and an inner (or optionally outer, not shown in FIG. 2) support tube 114 that is longer than the width of the substrate stack 120. At least two, approximately equally thick, flexible and gas permeable spacer strips 116 are laid above the top active surface 118 of a long stack 120 so that each strip 116 at least partially overlaps one of the two long side edges 122 of the surface 118. Alternatively, the strips 116 can be placed below the stack 120.

The combination of the stack 120 and spacer strips 116 is then rolled into a tightly wound roll, thus forming the remounted substrate roll 110, with its multiple layers 112 separated by the thickness of the strips 116. If the thickness of the strips 116 is constant along its length, then roll 110 may also be referred to as an Archimedes spiral roll. The thickness of the two strips 116 can optionally change along their length to allow an intentional controlled variation of the gap between the layers 112 as they progress from the most inner to the most outer layer of the roll 110. In a different embodiment of this invention, one or more additional gas permeable strips 116 can be placed between the two outer strips 116 to prevent the local collapse during CVD synthesis of a stack 120 that is wider than the stiffness of the stack 120 allows without it. The strips 116 allow for the process gases to enter the gap between the layers 112 from both sides and to diffuse along the length and width of the stack 120 thus helping with creating a more uniform gas environment inside the roll 110.

In further embodiments of this invention, the stack 120 may include a single substrate sheet 126 with only one active surface 118, a single substrate 126 having two opposing active surfaces 118, two substrates 126 each having a single side active surface 118, or one substrate 126 laid on top of the other so that both active surfaces 118 are located on the outside of the stack 120.

In another embodiment, the stack 120 is formed by a single substrate 126 with a top side active surface 118 that is supported by a stiffener 128 in the form of a single or multiple thin sheets made from an inert material that is compatible with the chosen CVD process. Such a stiffener may be thicker than the substrate sheet 126, and optionally be somewhat compressible in the radial direction of the roll 110 to minimize the wrinkling of the roll 110 during CVD processing due to differential thermal expansion differences of the material comprising the roll 100. Such a vertical compressibility with simultaneous stiffening properties in the width direction of the material 118 can, for example, be achieved by a slight sinusoidal corrugation of a metal foil with the corrugation waves being aligned parallel to the axis of the roll 110.

In a further embodiment, two single substrates 126 sandwich a stiffener 128 and have opposing external active surfaces 118. FIG. 2 shows such an embodiment where the stiffener 128 is sandwiched between two substrates 126 to allow the building of wider rolls 110 than the substrate or substrate pairs 126 allow on their own (without risking local gap changes during CVD processing) and without any additional strips 116 added between the two primary side strips 116 located near the long edges 122 of the stack 120. In one embodiment of this invention, the stiffener 128 has a similar thermal expansion coefficient as the substrate 126, or even more preferably, is made from the same material to minimize thermal expansion variations. In another embodiment of this invention, the stiffener is made from carbon and may include, for example, GraphFoil® (manufactured by GrafTech International Holdings), carbon paper (manufactured by Torray), and carbon felt. It can also be straight or on dimensional corrugated metal foils that are not active for a chosen CVD process, for example Cu and many other metal foils that by themselves are significantly catalytically inactive during the CVD based CNT growth.

The spacer strips 116 are gas permeable to allow easy gas access to the gap between two adjacent layers 112 along the long edges 122, and preferably are made from process compatible materials. Example of such strips 116, depending on the chosen CVD process, include nano-carbon paper, flat, perforated and/or grooved GraFoil®, non-woven carbon fiber paper, woven carbon fiber cloth, threads of carbon fibers, and ceramic cloth. Alternatively, a material that has a similar material composition to the substrate 126, for example in the form of a sintered, woven or foam like material, can be used to manufacture process compatible strips 116. Preferably, strips 116 allow for minor movement of the stack 120 positioned thereunder or above due to the thermal expansion of the stack 120, thereby reducing the tendency of kinking in the stack 120 during the heating and cooling process steps of the CVD Synthesis. The material for spacer strips 116 is preferably chosen to prevent layers 112 from locally welding to such strips and thereby to each other. Strips 116 can be made from a single material or be a composite of multiple materials, e.g., a 0.5 mm thick flat, sintered or corrugated (for enhanced gas permeability) stainless steel, Ni or Cu porous strips or foam sandwiched between two flat (e.g., 25-100 µm thick) and substantially gas tight (for minimal Cu vapor penetration) nano carbon papers strips (manufactured for example by CVD Equipment Corporation from 5-25% by weight of mm long carbon nano tubes and the rest from exfoliated graphite, or using strips cut from high density PGS sheets manufactured by Panasonic) or Grafoil® to better match the thermal expansion of the substrate 126 and to prevent any welding of the substrate 126 to such composite strips 116.

FIG. 2 shows one of many possible mounting options of a roll 110, i.e., internally supporting the roll with an extended hollow tube 114. The material of the tube 114 preferably has a similar expansion coefficient or is made from the same material as the flexible substrate 126, to minimize differential expansion between the roll 110 and the tube 114. The above-disclosed mounting schemes (internal or external mounting tube) of the remounted substrate roll 110 are not intended to be limiting. Other mounting schemes will be obvious to those skilled in the art, and are intended to be included in this invention.

As long as a process compatible combination of the various materials chosen to manufacture the support tube 114, the spacer strips 116, the flexible substrate foils 126 and optional stiffening sheets 118 have negligent influence on the outcome of the chosen CVD Synthesis, and sufficiently thick and porous strips 116 are selected, then large area, lower cost manufacturing of flexible substrate coated with thin films or with nano-structured materials may be achieved in substantially similar style tube furnace CVD reactors. In other words, this invention allows for the CVD processing of rolls of flexible substrates that can be much longer than the diameter of a given process tube without the need to switch to a roll-to-roll system or to substantially change the CVD processing conditions.

Optionally, depending on the springiness of the stack 120, it may be desirable to secure one or both ends of the roll 110 to prevent unwinding of such roll during transport and/or subsequent CVD processing. The securing of the ends of the roll 110 may be accomplished with carbon or SiC fiber threads, metal wire, metal wire mesh, metal foam, expanded metal sheets, non-woven or woven carbon fiber or metal wire fabric, flexible fabric, felt or mesh that has been sewn together into a continues sleeve, multi part assemblies designed to allow to reversibly change their inner or outer diameter, (i.e. Chinese finger cuffs), gravity assisted mechanism (i.e. pulley) that help to keep the roll 110 tight during handling and CVD processing. Again, a preferable option is to utilize wires or bands made from the same material as the substrate 126 to minimize thermal expansion differences. For example, a sleeve can be made (crimped) from the same material as the substrate 126 that keeps the roll 110 together mechanically during transport and CVD processing.

In one embodiment of this invention, the flexible substrate 126 is a metal foil. For example, to grow vertically aligned carbon nanotubes (VACNT) an alloy including Fe, Ni, Cr, (e.g., a 304 or 316 stainless steel foil) can be used as a base substrate, and then over coated at least on one side with a catalytic active material film. For example, to make one or both sides of such a foil catalytically active for VACNT growth, a preferably thin 5-50 nm $Al_2O_x$ barrier/diffusion limiting intermediary thin film is first deposited onto the metal foil and then covered with a 0.5-5 nm thick Fe, Ni, Co, MoC, FeNi, etc. catalytic active film. Such films can be deposited by e-beam, sputtering, liquid film deposition, etc. Optionally, a bonding layer, for example a 5-50 nm Fe-film, can be deposited before the $Al_2O_x$ layer to improve the adhesion. A wide range of catalytic active transition metal thin films have been shown to be able to grow VACNT's, either with none or with matching barrier intermediary thin film layers, and all of them are suitable candidates for this invention.

Alternatively, to grow silicon nanowires (SiNW), a 1-20 nm thin film Au layer can be deposited on a range of metal foils (e.g., SS 316 or SS 304) and/or open cellular foams sheets or onto flexible foils covered with another thin metal film (e.g., Ni, Cu, etc.). Such coated substrates can then be used for SiNW (Au thin film on SS foil) or SiNi NW (Au+Ni thin film on SS foil) or SiCu NW (Au+Cu thin film on SS foil or Au thin film on Cu foil) growth via CVD processing in the 450-700° C. range utilizing $SiH_4$ and $H_2$ as the primary active precursors gases. The intermediary layers (e.g., Ni, Cu) can alloy with the Si to form alloyed NW's or NW with core-shell structure, where one material is preferably located on the inside of the NW and the other is either located in the outside or both inside and outside the NWs.

Such single or double layer catalytically-active films can be created, for example, by physical vapor deposition (e.g., ebeam, sputtering, thermal evaporation, etc.) or liquid film deposition of dissolved catalytically-active material (for example ferrocene dissolved alcohol) and subsequent solvent evaporation.

FIG. 3 shows an embodiment of this invention where a mounted roll 110 is loaded axially inside a horizontal tube furnace CVD system, thus forming a high capacity CVD System 200 of the present invention where the process gases flow along the axis of the mounted roll 100. In the specific embodiment shown in FIG. 3, the support tube 114 is located with respect to a transfer arm 202 having a location stop 204, and is mechanically supported by standoff pins 206 that provide minimal thermal contact between the tube 114 and the arm 202. Other structure for supporting the support tube 114 is also contemplated herein, e.g., utilizing the shaft of the transfer arm 202, or utilizing blocks sitting inside the process tube to support and locate the internal tube 114 or equivalent external support tube.

Thus, the present invention allows a prior art tube furnace CVD system, typically used for substrate sizes that are smaller than the diameter of the respective process tube 16 or for flexible substrate 26 that are equal or narrow than the diameter of the process tube 16 or at least not longer than the circumference of the tube 16, to be utilized for scaled-up production of nano-structured materials. More particularly, it has been discovered herein that the replacement of prior art transfer arm 38 with the transfer arm 202 disclosed hereinabove, together with the disclosed remounted substrate roll 110, provides a scaled-up system which in turn allows the CVD processing of a flexible substrate 126 that can typically be 10-100 times longer than the inner diameter Ø of the tube 16, depending on the chosen thickness of the strips 116 (typically 0.05 mm-10 mm) which need to selected with respect to the width of the roll 110 and the chosen CVD process conditions.

TABLE I

Substrate area gain possible with the present invention over prior art utilizing a single flat substrate having a length = 79% of inner diameter Ø of the process tube.

| Process tube ID diameter | Process tube ID diameter | typical flat foil substrate width | D0 = inner diameter | D1 = outer diameter | Length of foil substrate | area gain for 2-sided foil substrate 0.5 mm gap | Length of foil substrate | area gain for 2-sided foil substrate 1 mm gap | Length of foil substrate | area gain for 2-sided foil substrate 5 mm gap | Length of foil substrate | area gain for 2-sided foil substrate 10 mm gap |
|---|---|---|---|---|---|---|---|---|---|---|---|---|
| [inch] | [mm] | [m] | [mm] | [mm] | [m] | | [m] | | [m] | | [m] | |
| 5 | 127 | 0.1 | 25 | 102 | 15 | 151 | 7.7 | 76 | 1.5 | 15 | 0.8 | 7.6 |
| 6 | 152 | 0.12 | 25 | 122 | 22 | 184 | 11 | 92 | 2.2 | 18 | 1.1 | 9.2 |
| 8 | 203 | 0.16 | 25 | 163 | 41 | 251 | 20 | 125 | 4.1 | 25 | 2.0 | 13 |
| 10 | 254 | 0.2 | 25 | 203 | 64 | 314 | 32 | 157 | 6.4 | 31 | 3.2 | 16 |
| 13 | 330 | 0.26 | 25 | 264 | 108 | 411 | 54 | 205 | 11 | 41 | 5.4 | 21 |
| 18 | 457 | 0.37 | 25 | 366 | 209 | 573 | 105 | 286 | 21 | 57 | 10 | 29 |
| 22 | 560 | 0.45 | 25 | 448 | 314 | 702 | 157 | 351 | 31 | 70 | 16 | 35 |
| 40 | 1016 | 0.81 | 25 | 813 | 1037 | 1,276 | 519 | 638 | 104 | 128 | 52 | 64 |

Figure 4:
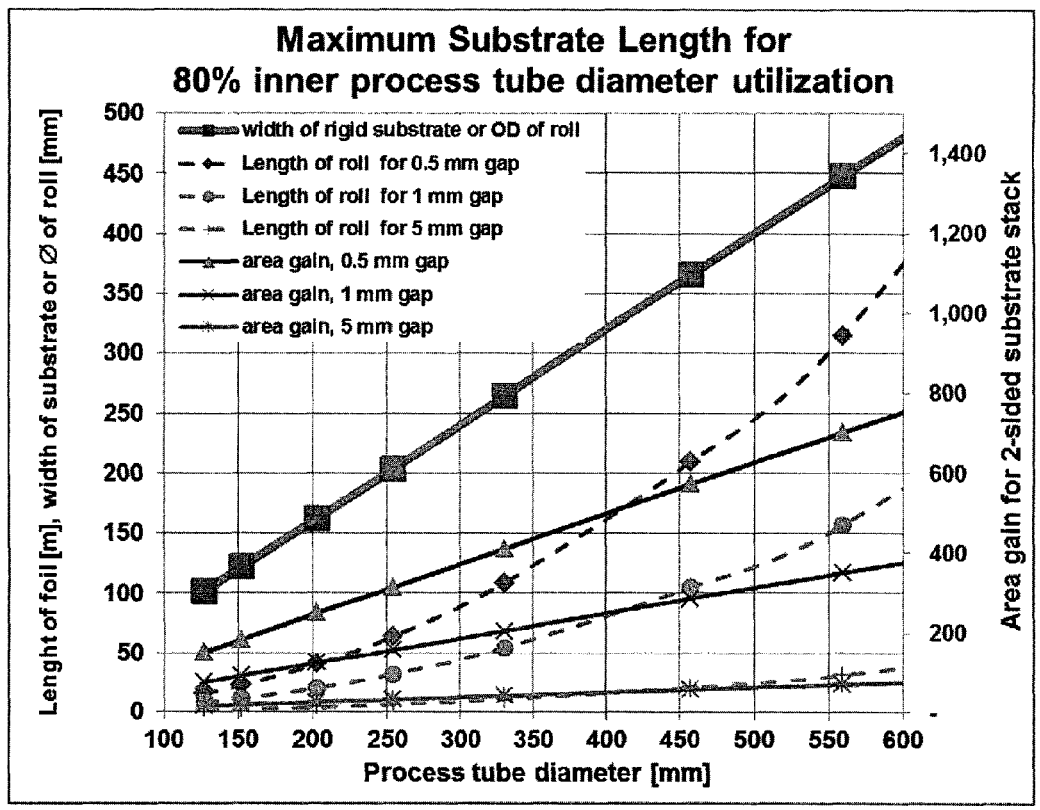
FIG. 4 shows the theoretical length capacity of a remounted substrate roll versus the inner diameter of a respective process tube for different substrate layer gap values.

Table I shows the theoretically maximum obtainable length and processable area gain of a flexible substrate transformed into a roll 110 having a 25 mm inner diameter and an outer diameter that is 79% of the inner diameter Ø of a given process tube 16. The length of the flexible foil and therefore also of the surface area gain is approximately inversely proportional to the height of the spacer strip 116 for multiple turn Archimedes spiral rolls (constant thickness strips 116) when the thickness of the stack 120 is much smaller than the height of the strips 116. The data from Table I is also displayed in FIG. 4. The larger the diameter Ø, the higher the capacity gains for this invention for a fixed inner diameter of the support tube 114. The area gain of this invention in maximum usable surface area over prior art is approximately linearly dependent on the diameter Ø. For example, to grow a 2 mm tall vertically aligned carbon nanotube array on stainless steel foils, at least a 6 mm gap between the layers 112 is needed. Depending on the width of the substrate 126, an even larger gap may be needed for uniform height growth along the axis.

Figure 5:
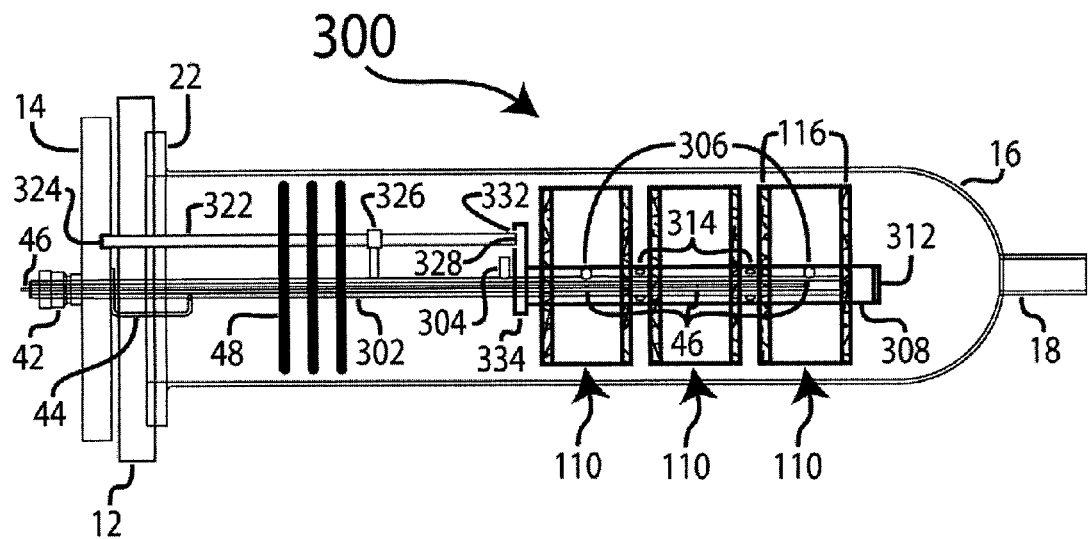
FIG. 5 shows multiple remounted substrate rolls loaded into an asymmetric process tube.

FIG. 5 shows further embodiments of this invention where multiple remounted substrate rolls 110 are loaded axially inside a horizontal CVD processing chamber 300, thus enabling the building of a high capacity CVD processing system in accordance with the present invention. The furnace for the processing chamber 300 is removed for clarity in FIG. 5. The CVD processing chamber 300 includes a transfer arm 302 with a stop 304, and optional multiple standoff pins 306 to minimize thermal heat sinking of a support tube 308. Only an internal support tube is shown in FIG. 5, but it should be understood that an external support tube can be used equivalently. Each roll 110 has two narrow side strips 116 to control the spacing of each layer 112. Process gas is delivered between two adjacent roll 110 pairs from the outside gap between the rolls 110 and the inner wall of the process tube 16 thus feeding the rolled substrates inside each roll 110 from both long edges 122.

FIG. 5 also shows the additional optional embodiment of this invention wherein support tube 308, onto which multiple rolls 110 are mounted, is closed at one end with a cap 312 and has holes 314 between two adjacent rolls 110 to facilitate the delivery of process gas to the gap between two adjacent rolls 110. An auxiliary removable gas injector 322 is mounted to a gas port 324 located on the inside of the end cap 14 in a sealed manner, and is supported by a fork 326 that is attached to the transfer arm 302. The respective thermal baffles 48 have cutouts to allow injector 322 to extend therethrough. The exit end 328 of the injector 322 is located near an entry port 332 of a distributor 334 that is connected to the open end of the support tube 308 in such a manner that most of the process gas exiting the end 328 is directed into entry port 332 of distributor 334, and from there to the interior of the support tube 308 from where it escapes through the holes 314 into the gaps between two adjacent rolls 110, thereby providing gas flow into this gap to increase the process uniformity for each individual roll 110. Optionally, the entry 332 of the distributor 334 is made from a removable seal that forms a quasi gas tight seal with the exit end 328 of the auxiliary injector 322. Optionally, the exit end 328 of the injector 322 is also capped and has a side hole nearby to eject the process gas perpendicular to the gas injector axis 322, and into the distributor 334. Optionally, a pin(s) can be inserted into one of the holes 314 to further help locate one of the ends of a roll 110 with respect to the support tube 308. In this arrangement, the remaining open holes 314 are capable of delivering a sufficient quantity of process gas into the gaps between the adjacent rolls.

The gap between the rolls 110 is preferentially chosen, depending on the available process conditions and gas flow delivery, to allow sufficiently uniform CVD Synthesis for each roll 110.

Figure 6:
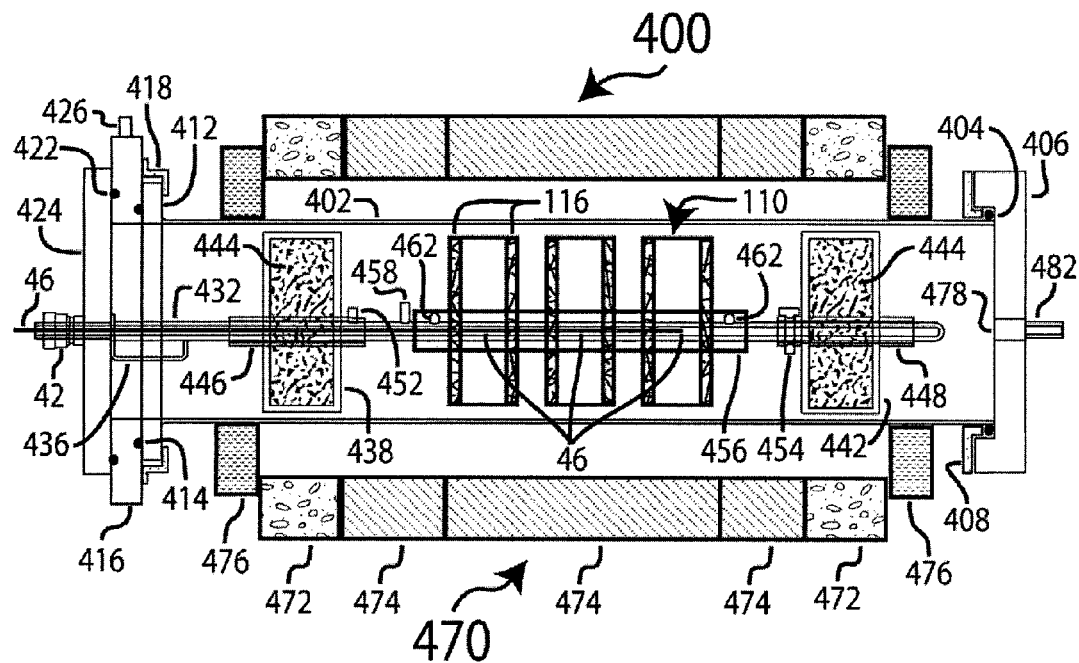
FIG. 6 shows multiple remounted substrate rolls loaded in a symmetric process tube.

FIG. 6 shows additional multiple embodiments of this invention in the form of a CVD process reactor 400. A symmetric straight process tube 402 is shown with two different end termination versions. The right end of the process tube 402 has a straight tube end that is sealed with an o-ring seal 404 positioned between the right end cap 406 and a screw-on compression ring 408 that compresses the o-ring 404 and thus seals the end cap 406 to the process tube 402. This style end-cap seal is typical for many lower cost R&D CVD systems, and is typically found on both ends of the respective process tube. The left side of the process tube 402 also has a straight end, but additionally includes a flange 412 welded thereto. Flange 412 is sealed to gas ring 416 via at least one o-ring 414, the o-ring 414 being compressed by a clamp 418 pressing against an edge of the flange 412. The other side of the gas ring 416 has at least one o-ring 422 that seals to a removable end cap 424. The gas ring 416 has at least one gas port 426 with at least one internal gas channel for delivering at least one process gas to the inside of the process tube 402, and optionally (not shown in FIG. 6) to internal gas delivery channels inside the end cap 424, which then delivers process gases to at least one gas port that connect to one or more optional internal gas injectors (also not shown in FIG. 6) or other internal gas ports. An optional transfer arm 432 is sealed and connected to the end cap 424 with a seal 434, and is additionally supported with an optional holder 436. FIG. 6 also shows the example of two removable thermal baffles 438 and 442 in the form of an evacuated and sealed quartz cylinder filled with ceramic wool 444. Each baffle is located near a respective end cap, and an internal mounting tube 446 and 448. A fixed locating pin 452 on the transfer arm locates the baffle 438, and the removable pin 454 both locates the baffle 442 and allows for its quick removal from the transfer arm 432 to allow loading of one or more substrate rolls 110 mounted on a support tube 456. Locating pin 458, together with the thermal isolating standoff pins 462, provide a reproducible location function for the support tube 456. FIG. 6 shows the example of a furnace 470 which surrounds the processing zone of the process tube 402 having outer insulation zones 472 and inner individually controllable heating zones 474. Additional optional insulating zones 476, together with the thermal baffles 438 and 442, can be used to further reduce the radiation loss from the heated part of the process tube and provide a more uniform temperature zone for the processing zone of the CVD synthesis system holding at least one roll 110. The inside of the hollow sealed transfer arm 432 can hold one or more thermocouples 46 that can be used for feedback control of the heating zones 474.

Process gas is preferably directed into at least one gas port 426, flows through the gas ring 416 and/or the end cap 424, and then exists through a hole 478 in the end cap 406, and through an exit port 482. Alternatively, the process gas can escape through a respective gas port in the gas ring 416.

Figure 7:
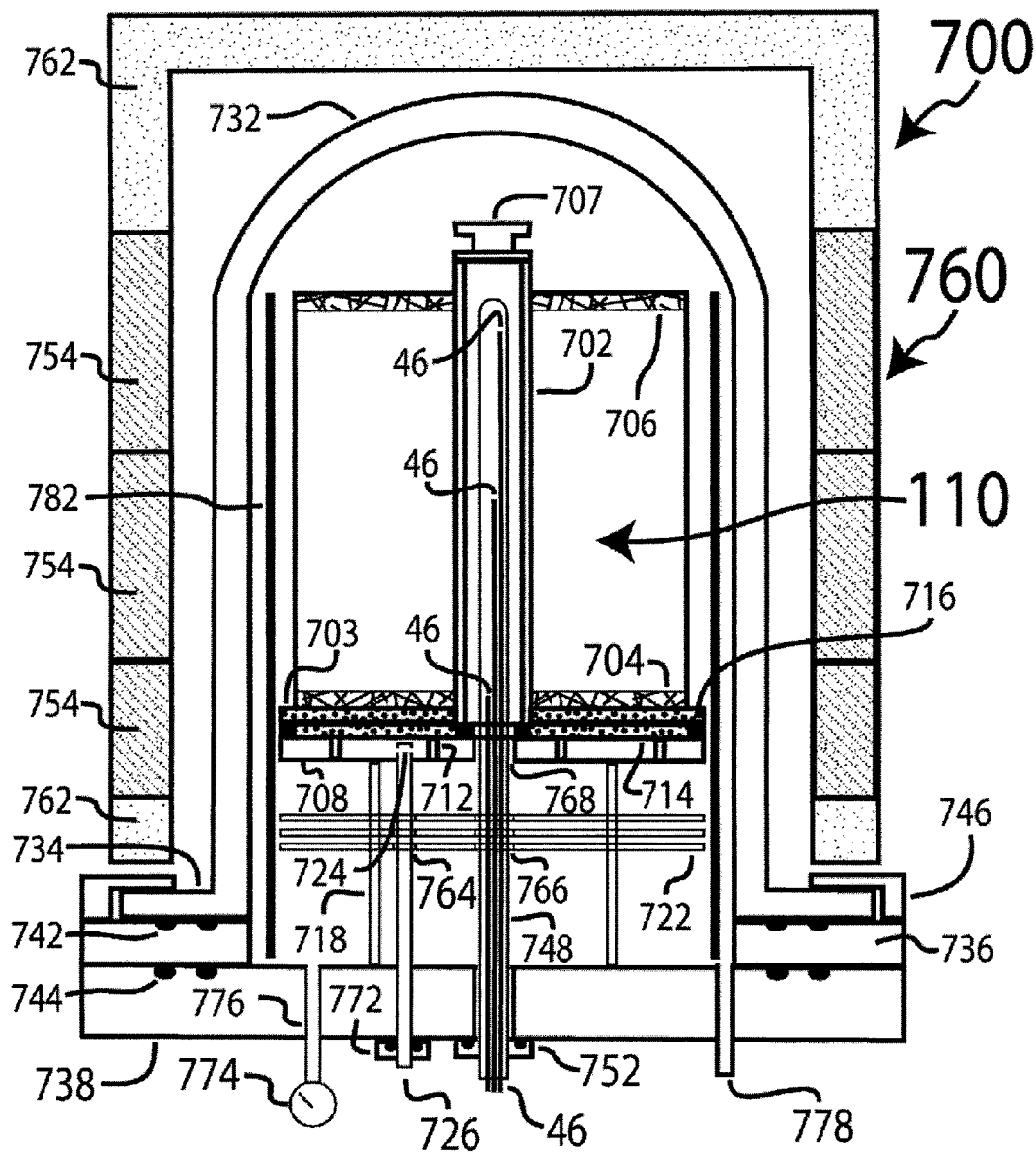
FIG. 7 shows a CVD reactor with a vertical process tube and a vertically oriented remounted substrate roll.

FIG. 7 shows additional embodiments of this invention in the form of a vertical CVD process chamber 700 that holds at least one vertically oriented roll 110 with an inner support tube 702 that has an optional attached porous support plate 703 at its bottom end. The bottom of the bottom roll 110 is supported by the gas permeable plate 703. The tube 702 extends beyond the top spacer strip 706, and has an optional handle 707 that allow for the grasping, lifting and transport of the support tube 702 with at least one loaded substrate roll 110 and for the placing/removal of support tube 702 on/from a support table 708. This grasping and lifting can be done manually or robotically. If multiple vertical rolls 110 are being used, they can be supported by auxiliary porous support means, i.e. removable bars, removable porous disk located by removable pins placed through the support tube 702. The table 708 is shown in the form of a hollow body with internal support posts 712, with a gas permeable top section 714 across the extent of the bottom end of the roll 110, and with a non-gas permeable top section 716 to channel process gas into the roll 110. Standoff legs 718 support the table 708 and one or more thermal baffles 722. The exit end 724 of a gas injector 726 is located either inside or near an entrance hole of the hollow body of the table 708, thus allowing process gases to reach between the individual layers of the substrate roll 110 by first being spread uniformly through the hollow body of the table 708, then through the gas permeable section 714 of the support plate 703, and subsequently through the gas permeable spacer strip 704. If multiple rolls 110 are supported by the tube 702, process gas reaches the 2nd and higher roll 110 through the gas exiting the top strip 706 of the lower placed roll 110, and optionally through process gas going around the lower rolls 110 and/or through optional side holes in the support tube 703 allowing process gas to enter and exit at different height along the tube 702 (not shown in FIG. 7). The exit end 724 of the injector 726 can optionally be sealed with process compatible gaskets to the table 708, and can have a cap at the end and side holes nearby to allow the process gas to eject sideways into the table 708.

The sealed CVD process chamber is primarily formed by a vertically oriented bell jar type process tube 732 with a welded flange 734, a support ring 736, a base plate 738, and top and bottom o-ring seals 742 and 744. The flange 734 is pressed by a mounting ring 746 against the seal 742. The plate 738 is preferably pressed against the seal 744 with a spring loaded translation mechanism to allow easy loading and off-loading of the roll 110 mounted on the support tube 702. A sealed thermocouple sleeve 748 located inside the tube 702 with a gas tight seal 752 at the base plate 738 can hold one or more thermocouples 46, with each thermocouple 46 providing a process temperature feedback signal that can be used to control a heating zone 754 of a furnace 760 having additional insulating zones 762 at its bottom and top end. Clearance holes 764, 766 and 768 in the thermal baffles 722 and table 708 allow interference free passage for the removable injector 726 and the removable shield 748. An o-ring seal 772 is preferably located at the end of injector 726. One or more pressure sensors 774 may be connected to the base plate 738 or ring 736 through a respective sealed gas line 776 to allow the monitoring of pressure inside the process tube 732. The removal of process gas from the process chamber is done through an exhaust port 778 and an optional internal gas shield 782 that forces the process gases to primarily go from the inject line 726 through the support roll(s) 110, and then uniformly escape between the inner walls of the process tube 702 and the other wall of the shield 782 towards the exhaust 778. Optionally, the process gas can also be exhausted through the gas port in the top of the process tube 732 and furnace 760, or through other appropriately placed exhaust ports.

The minimum acceptable height of the strips 116 (and therefore the maximum achievable area gain with this invention over conventional prior art flat single substrate R&D systems) depends on the length of the flexible substrate, the process condition of the CVD Synthesis, the flow rates and residence time of the process gases in the process tube, and the type of nano-structured material to be grown on the catalytically-active substrates, and typically needs to be optimized for each new CVD Synthesis processing opportunity to maximize productivity and minimize the production cost. For example, in order to grow a 2 mm size VACNT, one must assume that a minimum gap of 6 mm or more is needed for double sided VACNT growth on 20-150 µm thick SS flexible foil substrates with double sided coated catalytic active surfaces 118. If, on the other hand, SiNW or Si-allow NWs are grown on narrow foils <75 mm, smaller heights of spacer strips 116 are potentially possible for lower pressure CVD operations. Similarly, if the purpose of a given CVD synthesis is mass production of a surface film modified steel sheet with less than 10 µm thick Si, Cr, Ni films or stainless steel-like alloy films, to provide, for example, increased corrosion resistance, i.e. more stainless steel-like surface, tighter gaps are acceptable to increase production size per batch and lower the production cost per coated surface area.

This invention thus allows the CVD process and system hardware developed during an R&D phase of the nano material growth or CVD thin film process development to be ported over to a scaled up production system. Further, a relatively minor upgrade to an existing prior art CVD System allows, in many instances, a significant improvement (5×-100×, depending on the gap between the layers 112) in the production capacity of a given tube furnace system.

Figure 8:
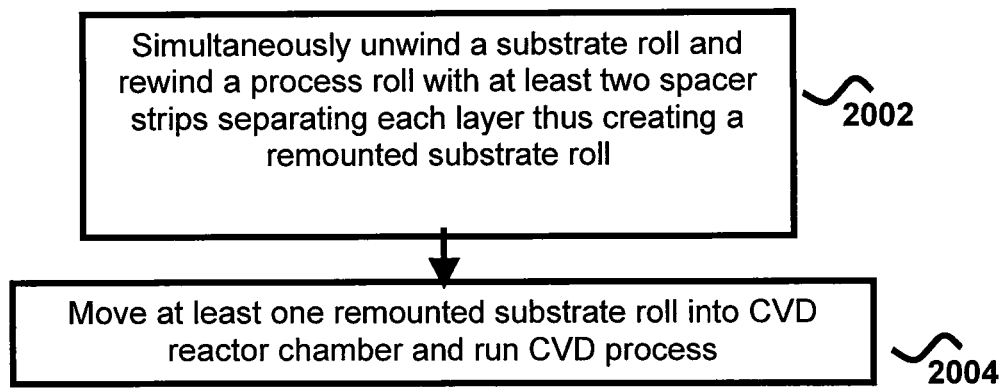
FIG. 8 shows a method to create a remounted substrate roll

FIG. 8 shows a further embodiment of this invention and, more particularly, the process steps for transforming a flexible substrate roll into a remounted substrate roll, and then processing it via a CVD process to create a large area CVD processed surface area without the utilization of a roll-to-roll system. In step 2002, a substrate foil is simultaneously unwound while any respective separator layer is simultaneously removed, and then rewound with the addition of at least two spacer strips 116 to form a spiral wound roll with each substrate layer spaced apart by a spacer strip near the long edges of the flexible substrate roll, thus forming a roll 110. In step 2004, at least one remounted substrate roll is inserted into a horizontal or vertical tube furnace and subjected to a CVD process, thus processing the whole substrate roll in a batch mode process.

Figure 9:
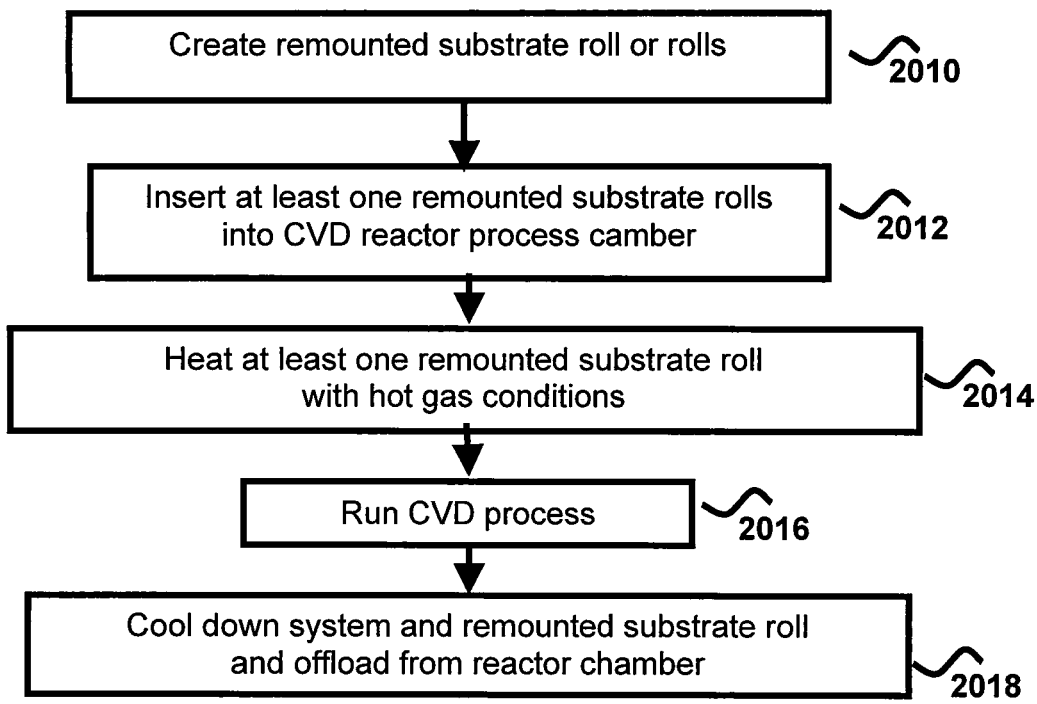
FIG. 9 shows a method for the CVD processing of a remounted substrate roll

FIG. 9 describes another embodiment of this invention and, more particularly, the process steps for the CVD processing of a continuous flexible substrate roll in a CVD batch processing system. After creating at least one remounted substrate roll 110 in step 2010, and inserting it into a horizontal or vertical CVD tube furnace system in step 2012, the heating uniformity of the remounted substrate roll is enhanced by a close to atmospheric process operation in step 2014 in an inert atmosphere that pushes hot process gases through the gaps between the individual layers of the roll. Such heating can be enhanced, for example, by adding a fan to a quasi-sealed CVD process chamber (minimum gas exit to conserve heat losses) made from process compatible material (e.g., a quartz fan) to help with heating the metal foil by increasing the gas recirculation and convection heating the inner part of the roll 110 with hot gases. Subsequent CVD processing in step 2016, and offloading in step 2018, yields a CVD processed roll of flexible substrate.

Of course, the remounting of the substrate roll can be in line with the catalytic film deposition (if needed for the CVD process) onto the substrate roll to minimize the handling of the substrate roll.

While only selective embodiments of this invention have been discussed above, it should be understood that combinations of the above mentioned embodiments, as well as obvious modifications thereof, as easily understood by the skilled in the arts, are therefore intended to be included in this disclosure.

What is claimed is:

1. A method for large area production of CVD-processed materials, the method comprising the steps of:
   a) positioning a first remounted substrate roll into the primary reaction chamber of a batch process chemical vapor deposition synthesis system, said roll being formed of i) an extended first substrate having a width W, a length L and a thickness T, wherein T<<W<<L, and ii) at least two outer spacer strips, and wherein said first substrate is wound in its length direction in such a manner that said outer spacer strips are inserted between each consecutive layer of said roll and located near the edges of said width of said substrate;

b) processing said roll via chemical vapor deposition, said outer spacer strips being formed of a material which is substantially open thus permitting substantially uninhibited process gas exchange between the internal and external volume of said roll; and c) removing said roll from said process chamber after completion of said chemical vapor deposition process.

2. The method according to claim 1, wherein the thickness of said outer spacer strips varies along the length thereof to provide a controlled variation in the distance between adjacent layers of said roll from the innermost layer to the outermost layer.

3. The method according to claim 1, wherein said roll further includes an intermediate spacer strip extending through each of said consecutive layers and located between said outer spacer strips.

4. The method according to claim 1, wherein said roll further includes a stiffener extending along the edges of each of said consecutive layers.

5. The method according to claim 4, wherein said roll further includes an extended second substrate, and wherein said stiffener is sandwiched between said first and second substrates.

6. The method according to claim 1, wherein said substrate is rolled on an internal support tube.

7. The method according to claim 6, wherein said spacer strips and internal support tube are formed of materials which are substantially inert to said chemical vapor deposition process.

8. The method according to claim 1, comprising the further step of:
mechanically securing the outermost layer of said roll to the remainder of said roll to prevent said roll from unwinding during transport or processing.

9. The method according to claim 1, wherein the heating of said substrate during said chemical vapor deposition process is performed near or below atmospheric pressure.

10. The method according to claim 1, comprising the further steps of:
unwinding said substrate;
providing a catalytically-active film on at least one side of said substrate; and
rewinding said substrate and said outer spacer strips to provide said first remounted substrate roll.

11. The method according to claim 1, wherein said substrate is formed by providing a catalytically-active film on at least one side of a metal foil.

12. The method according to claim 11, wherein said metal foil is formed primarily of stainless steel, nickel or copper, and wherein said catalytically-active film has a structure selected from the group consisting of single layer, multi-layer, homogenous layer and graduated layer, and wherein each said layer of said film has a function selected from the group consisting of catalytically-active layer, barrier layer, adhesion promotion layer and spacer layer, and wherein at least one of said layers of said film is formed by e-beam deposition, spattering, liquid processing, thermal spray, plasma spray, thermal oxidation, chemical reaction, or CVD processing, and wherein at least one of said layers of said film includes elements selected from the group consisting of Au, Pt, Fe, Ni, Co, Mo, Cr, Ti, Cu, $SiO_2$, $SiO_x$, $Al_2O_3$, $Al_2O_x$ or respective alloys and material combinations thereof.

13. The method according to claim 12, wherein said processing step includes the further steps of a) supplying a hydrocarbon containing precursor gas, and b) synthesizing nanotubes on said first substrate.

14. The method according to claim 12, wherein said processing step includes the further steps of a) supplying at least one precursor selected from the group consisting of $SiH_4$, $HSiCl3$, $H_2SiCl_2$ and $SiCl_4$, and b) synthesizing nanowires on said first substrate.

15. The method according to claim 1, wherein said first substrate is steel foil; and
wherein said processing step provides a thin film on said substrate for increased corrosion resistance.

16. The method according to claim 1, wherein said substrate is rolled on a support tube; and
wherein said chemical vapor deposition synthesis system includes a transfer arm for receiving said support tube.

17. The method according to claim 1, further comprising the step of positioning a second remounted substrate roll into said primary reaction chamber.

18. The method according to claim 17, wherein said first and second rolls are rolled on a support tube, and wherein said chemical vapor deposition synthesis system includes a transfer arm for receiving said support tube.

19. The method according to claim 1, further comprising a support tube having a porous support plate at one end and a handle at the other end, said remounted substrate roll being wound on said support tube; and
wherein said primary reaction chamber is vertically-oriented and includes a support table; and
wherein said support tube is loaded into said chamber such that said support plate rests on said support table.

20. A remounted substrate roll, comprising:
a rolled-up flexible substrate forming an Archimedes spiral and defining a plurality of consecutive layers, said substrate having at least one catalytically-active surface and defining a width W, a length L and a thickness T, wherein $T \ll W \ll L$; and
at least two outer spacer strips, said outer spacer strips being located between each of said consecutive layers of said roll and near the edges of the width of said substrate, said outer spacer strips being formed of a material which is substantially open thus permitting substantially uninhibited process gas exchange between the internal and external volume of said roll.

* * * * *